(12) United States Patent
Takemura

(10) Patent No.: US 8,891,285 B2
(45) Date of Patent: Nov. 18, 2014

(54) SEMICONDUCTOR MEMORY DEVICE

(75) Inventor: Yasuhiko Takemura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 217 days.

(21) Appl. No.: 13/478,215

(22) Filed: May 23, 2012

(65) Prior Publication Data

US 2012/0314482 A1  Dec. 13, 2012

(30) Foreign Application Priority Data

Jun. 10, 2011  (JP) ................. 2011-129685

(51) Int. Cl.
*G11C 11/24* (2006.01)
*G11C 11/4094* (2006.01)
*G11C 11/4076* (2006.01)
*G11C 11/406* (2006.01)
*G11C 11/403* (2006.01)
*G11C 11/4074* (2006.01)

(52) U.S. Cl.
CPC ........ *G11C 11/4094* (2013.01); *G11C 11/4076* (2013.01); *G11C 11/406* (2013.01); *G11C 11/4074* (2013.01); *G11C 11/403* (2013.01)
USPC ................. 365/149; 365/150; 365/230.06

(58) Field of Classification Search
CPC ........... G11C 11/406; G11C 11/40615; G11C 11/4076; G11C 11/4074; G11C 8/08; G11C 11/4094; G11C 11/403
USPC ..................... 365/149, 150, 230.06
See application file for complete search history.

(56) References Cited

U.S. PATENT DOCUMENTS 4,777,625 A  10/1988  Sakui et al.
4,905,194 A *  2/1990  Ohtsuka et al. ......... 365/185.23

(Continued)

FOREIGN PATENT DOCUMENTS

EP  1 737 044 A1  12/2006
EP  2 226 847 A2  9/2010

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Pho M Luu
(74) *Attorney, Agent, or Firm* — Fish & Richardson P.C.

(57) ABSTRACT

An object is to increase the retention characteristics of a memory device formed using a semiconductor with a wide bandgap, such as an oxide semiconductor. A transistor including a back gate (a back gate transistor) is inserted in series at one end of a bit line so that the back gate is constantly at a sufficiently negative potential. The minimum potential of the bit line is set higher than that of a word line. When power is turned off, the bit line is cut off by the back gate transistor, ensuring prevention of outflow of charge accumulated in the bit line. At this time, the potential of a source or a drain (bit line) of a cell transistor is sufficiently higher than that of a gate of the cell transistor (0 V), so that the cell transistor is put in a sufficiently off state; thus, data can be retained.

24 Claims, 10 Drawing Sheets

(56) References Cited

U.S. PATENT DOCUMENTS

| | | | |
|---|---|---|---|
| 5,161,121 A * | 11/1992 | Cho | 365/189.06 |
| 5,305,263 A * | 4/1994 | Morgan | 365/190 |
| 5,610,533 A | 3/1997 | Arimoto et al. | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,477,098 B1 * | 11/2002 | Raad | 365/207 |
| 6,563,174 B2 | 5/2003 | Kawasaki et al. | |
| 6,707,720 B2 | 3/2004 | Kamei et al. | |
| 6,727,522 B1 | 4/2004 | Kawasaki et al. | |
| 6,771,531 B2 * | 8/2004 | Nishihara | 365/145 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,826,298 B2 | 11/2010 | Nakai et al. | |
| 7,852,704 B2 * | 12/2010 | Takahashi et al. | 365/230.06 |
| 8,067,775 B2 | 11/2011 | Miyairi et al. | |
| 8,072,798 B2 | 12/2011 | Takeyama | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0279474 A1 | 11/2010 | Akimoto et al. | |
| 2011/0101351 A1 | 5/2011 | Yamazaki | |
| 2011/0102409 A1 | 5/2011 | Hayakawa | |
| 2011/0134680 A1 | 6/2011 | Saito | |
| 2011/0156027 A1 | 6/2011 | Yamazaki et al. | |
| 2011/0182110 A1 | 7/2011 | Yamazaki et al. | |
| 2011/0199351 A1 | 8/2011 | Kurokawa | |
| 2011/0317474 A1 | 12/2011 | Kato | |
| 2012/0014157 A1 | 1/2012 | Kato et al. | |
| 2012/0051118 A1 | 3/2012 | Yamazaki et al. | |
| 2012/0061668 A1 | 3/2012 | Miyairi et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-245482 A | 9/1997 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

(56) References Cited

OTHER PUBLICATIONS

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R. et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kimizuka, N. et al.,"Spinel,YbFe2O4, and Yb2Fe3O7 Types of Structures for Compounds in the In2O3 and SC2O3-A2O3-BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N. et al., Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System, Journal of Solid State Chemistry, Apr. 1, 1995, vol. 116, No. 1, pp. 170-178.

Kurokawa, Y et al., "UHF RFCPUS on Flexible and Glass Substrates for Secure RFID Systems," Journal of Solid-State Circuits , 2008, vol. 43, No. 1, pp. 292-299.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering,"SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

OHara, H et al., "21.3: 4.0 IN. QVGA Amoled Display Using In-Ga-Zn-Oxide TFTS With a Novel Passivation Layer," SID Digest '09 : SID International Symposium Digest of Technical Papers, May 31, 2009, pp. 284-287.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED." AM-FPD '08 Digest of Technical Papers, Jul. 2, 2008, pp. 275-278.

Sakata, J et al., "Development of 4.0-IN. AMOLED Display With Driver Circuit Using Amorphous In—Ga—Zn—Oxide TFTS," IDW'09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator,"Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Leters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for Amoled Back-Plane," SID Digest '09 : SID International Symposium Digest of Technical Papers, May 31, 2009, pp. 280-283.

(56) References Cited

OTHER PUBLICATIONS

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous IN-GA-ZN-Oxide TFT," SID Digest '09: SID International Symposium Digest of Technical Papers, May 31, 2009, pp. 1110-1112.

Godo, H et al., "Temperature Dependence of Characteristics and Electronics Structure for Amorphous IN-GA-ZN-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08: SID International Symposium Digest of Technical Papers, May 20, 2008, vol. 39, pp. 621-624.

Hirao, T et al.. "Novel Top-Gate Zinc Oxide Thin-Film Transistors (ZNO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Ikeda., T et al., "Full-Functional System Liquid Crystal Display Using CG-Silicon Technology," SID Digest '04: SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Kanno, H et al., "White Stacked Electrophosphoreent Organic Light-Emitting Devices Employing M003 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214TH ECS Meeting, 2008, No. 2317, 1 page.

Kimizuka, N et al., "Spinel, YBFE2O4, and YB2FE3O7 Types of Structures for Compounds in the IN2O3 and SC2O3-A2O3-BO Systems [A; Fe, Ga, or AL; B: MG, MN, FE, NI, CU, or ZN] at Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06: Proceedings of the 13TH International Display Workshops, Dec. 7, 2006, pp. 663-666.

Lee, J et al., "World'S Largest (15-Inch) XGA AMLCD Panel Using IGZO Oxide TFT," SID Digest '08: SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C et al., "Modulated Structures of Homologous Compounds InMO3(ZnO)m (M=In, Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07: SID International Symposium Digest of Technical Papers, 2007, vol. 38, pp. 1673-1676.

Mo, Y et al., "Amorphous Oxide TFT Backplanes for Large Size AMOLED Displays," IDW '08: Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crys-

(56) References Cited

OTHER PUBLICATIONS talline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09: SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09: SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09: SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Park, J et al., "Amorphous Indium-Gallium-Zinc Oxide TFTs and Their Application for Large Size Amoled." AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09: Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3-In2O3-ZnO) TFT," SID Digest '08: SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K et al., "Ultra Low Power Consumption Technologies for Mobile TFT-LCDs," IDW '02: Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

SEMICONDUCTOR MEMORY DEVICE

BACKGROUND OF THE INVENTION

1. Field of the Invention

The present invention relates to a memory device formed using a semiconductor.

2. Description of the Related Art

Semiconductor memory devices include dynamic random access memories (DRAMs) (see Patent Document 1, for example). In a DRAM, memory cells 105 each including a cell transistor 106 and a capacitor 107 as illustrated in FIG. 2B are arranged in a matrix as illustrated in FIG. 2A, and a gate and a drain of the cell transistor 106 are connected to a word line 103 and a bit line 104, respectively. Moreover, the DRAM includes a row driver 101 for driving a plurality of word lines and a column driver 102 for driving a plurality of bit lines.

The DRAM is powered by an external power supply to drive the row driver 101 and the column driver 102. Note that a cell transistor formed using silicon semiconductor has a small drain current (off-state current) even in the off state, and thus requires tens of refresh operations (operations for replenishing the capacitor with charge) per second. In other words, the DRAM needs to be powered by the external power supply to retain a stored state.

In recent years, it has been found that charge can be retained for a very long period of time by utilizing the very low off-state current of transistors formed using an oxide semiconductor whose bandgap is two or more times that of silicon semiconductor. For example, the theoretical off-state current (drain current in the off state) of a semiconductor with a bandgap of 2.5 electron volts or more is $10^{-26}$ A or less. The use of a memory circuit utilizing this as a nonvolatile memory has been proposed (see Patent Documents 2 to 4).

A transistor used in such a memory needs to exhibit sufficiently high off resistance (the resistance of the transistor in the off state), i.e., sufficiently low off-state current. For example, in order to retain charge in a capacitor of 30 fF, which is the capacitance of capacitors used in a DRAM in common use, for 10 years, a transistor exhibiting a resistance of as high as $1\times10^{22}\Omega$ or more in the off state is required. Assuming that the drain voltage is +1 V, the off-state current of the transistor needs to be 100 yA ($1\times10^{-22}$ A) or less.

The drain current of a transistor formed using an oxide semiconductor with a wide bandgap in the subthreshold region can be roughly estimated from the subthreshold value and the threshold voltage. The theoretical lower limit of the subthreshold value at room temperature (27° C.) is 60 mV/decade.

For example, assuming that the threshold voltage is +1 V, the subthreshold value is 60 mV/decade, and the drain current obtained when the threshold voltage is +1 V is 1 μA (the source potential Vs is 0 V, while the drain potential Vd is +1 V), the drain current is 100 yA with a gate potential Vg of +40 mV. With a gate potential Vg of 0 V, the drain current of the transistor is less than 100 yA, so that the charge in the capacitor can be retained for 10 years.

Note that the retention period is not limited to 10 years, and may be determined in the range from 10 seconds to 100 years depending on intended use. The capacitance of the capacitor or the off resistance or off-state current of the transistor may be set according to the retention period.

The above-described drain current is obtained at room temperature. In practice, some problems arise here. The subthreshold value depends on temperature. As temperature increases, the subthreshold value increases. Because it is also possible that the semiconductor memory device is stored at a high temperature, sufficient retention characteristics need to be also ensured at a temperature exceeding room temperature.

For example, the theoretical lower limit of the subthreshold value at 95° C. is 74 mV/decade. When the subthreshold value is 74 mV/decade, gate potential Vg with which the drain current becomes 100 yA is −180 mV. When the gate potential Vg is 0 V, the drain current is 10 zA ($1\times10^{-20}$ A), so that charge retention time is 1% of that at room temperature.

As transistor size is decreased, the subthreshold value increases owing to short channel effects. The conductivity type of silicon semiconductor can be controlled by doping. Therefore, in the case of an n-channel transistor, for example, short channel effects can be reduced by increasing the concentration of a p-type dopant in the channel formation region.

In contrast, the conductivity type of an oxide semiconductor cannot be controlled by controlling dopant concentration as in the case of silicon semiconductor. The intensity of one conductivity type of an oxide semiconductor can be changed, but the conductivity type of an oxide semiconductor cannot be reversed; for example, an n-type oxide semiconductor cannot be turned into a p-type one by doping. For this reason, short channel effects cannot be reduced by reversing the conductivity type of the channel formation region.

Therefore, with a channel length of 100 nm or less, the subthreshold value is 100 mV/decade or more, and the gate potential Vg needs to be maintained at −0.6 V or less. The threshold voltage is +1 V in the above description; when the threshold voltage is low, even the gate potential Vg at room temperature or with a long channel needs to be less than 0 V in order to sufficiently increase the off resistance. Note that the threshold voltage is dependent on the work function of a material for the gate; thus, it is difficult to increase the threshold voltage to +1.5 V or higher.

Under such conditions, data loss may occur when power from the external power supply to the semiconductor memory device is interrupted and the potential of the gate becomes the same as that of the source (i.e., Vg=0 V). Since potential is relative, the potentials of portions of the semiconductor memory device are assumed, in the description below, to become 0 V after the interruption of power from the external power supply, although it may take slightly longer or shorter.

REFERENCES

[Patent Document 1] U.S. Pat. No. 4,777,625
[Patent Document 2] United States Patent Application Publication No. 2011/0101351
[Patent Document 3] United States Patent Application Publication No. 2011/0156027
[Patent Document 4] United States Patent Application Publication No. 2011/0182110

SUMMARY OF THE INVENTION

It is an object of one embodiment of the present invention to provide a memory device that is formed using a semiconductor with an irreversible conductivity type and a bandgap of 2.5 electron volts or more, such as an oxide semiconductor, is sufficiently integrated, and is capable of retaining data for a needed period even during interruption of power from an external power supply. It is another object of one embodiment of the present invention to provide a memory device with a novel structure or a method for driving the memory device, particularly a memory device whose power consumption can be reduced or a method for driving the memory device.

The terms used in this specification for the description of the present invention are briefly described. First, when one of a source and a drain of a transistor is called a drain, the other is called a source in this specification. That is, they are not distinguished depending on the potential level. Therefore, a portion called a source in this specification can be alternatively referred to as a drain.

Further, even when the expression "be connected" is used in this specification, there is a case in which no physical connection is made in an actual circuit and a wiring is just extended. For example, in a transistor circuit, there is a case in which one wiring serves as gates of a plurality of transistors. In that case, one wiring may have a plurality of branches to gates in a circuit diagram. In this specification, the expression "a wiring is connected to a gate" is also used to describe such a case.

One embodiment of the present invention is a semiconductor memory device, which includes a column driver, at least one bit line, at least one word line, at least one memory cell, and a transistor including a back gate (a back gate transistor). The memory cell includes a transistor and a capacitor. A source of the transistor is connected to the bit line. A drain of the transistor is connected to one electrode of the capacitor. A gate of the transistor is connected to the word line. A drain of the back gate transistor is connected to the bit line. A source of the back gate transistor is connected to the column driver. The potential of the back gate of the back gate transistor is lower than the minimum potential of the word line.

One embodiment of the present invention is a semiconductor memory device, which includes a column driver, at least one bit line, at least one word line, and at least one memory cell. The memory cell includes a transistor and a capacitor. A source of the transistor is connected to the bit line. A drain of the transistor is connected to one electrode of the capacitor. A gate of the transistor is connected to the word line. The bit line is connected to the column driver. The bit line includes a back gate transistor at one end. The potential of a back gate of the back gate transistor is lower than the minimum potential of the word line.

One embodiment of the present invention is a semiconductor memory device, which includes a column driver, at least one bit line, at least one word line, at least one memory cell, and a back gate transistor. The memory cell includes a transistor and a capacitor. A source of the transistor is connected to the bit line. A drain of the transistor is connected to one electrode of the capacitor. A gate of the transistor is connected to the word line. The bit line is connected to the column driver. The back gate transistor is inserted in series in the bit line. The potential of a back gate of the back gate transistor is lower than the minimum potential of the word line.

In the above-described semiconductor memory devices, two or more back gate transistors may be inserted in the bit line. A wiring connected to the back gate of the back gate transistor may be in a floating state. The back gate of the back gate transistor may be connected to a negative electrode of a battery which is additionally provided in the semiconductor memory device. Further, the drain of the transistor in a memory cell may be connected to a gate of another transistor in that memory cell. Furthermore, one or more sense amplifiers may be inserted in the bit line. The semiconductor memory device preferably includes a circuit for controlling a gate of the back gate transistor.

Moreover, it is preferable that the minimum potential of the bit line be higher than the minimum potential of the word line by 1 V or more. Further, it is preferable that the maximum potential of the gate of the back gate transistor be higher than the maximum potential of the word line by 1 V or more.

Furthermore, it is preferable that the potential of the back gate of the back gate transistor be lower than the potential of any other portion.

Note that the foregoing applies to the case where the transistor in the memory cell and the back gate transistor are n-channel transistors. In the case where the transistor in the memory cell and the back gate transistor are p-channel transistors, the above-described potential combination is reversed; the one expressed with "high" and the one expressed with "low" in the above description are expressed with "low" and "high", respectively, and the one expressed with "maximum" and the one expressed with "minimum" in the above description are expressed with "minimum" and "maximum", respectively.

First, the effect of the back gate transistor will be described. The back gate transistor has a structure in which a semiconductor layer is sandwiched between the gate and the back gate. In one embodiment of the present invention, the potential of the back gate is preferably set constant. The off-state current of the back gate transistor can be sufficiently reduced by using a semiconductor with a wide bandgap as described above.

The drain current Id of an n-channel transistor which does not have a back gate is represented by a curve A in FIG. 5A. It is assumed here that the source potential Vs of the transistor is 0 V and the drain potential Vd thereof is higher than 0 V. As illustrated, at a gate potential Vg of 0 V, the drain current Id is considerably large. On the other hand, at a gate potential Vg of $-V_1$ ($<0$), the drain current Id is at a negligible level. The value of $V_1$ may be set as appropriate depending on the structure of the transistor or the like, but is preferably higher than or equal to +1 V.

Note that the minimum of the drain current Id ideally depends on the bandgap of a semiconductor, and that of a transistor formed using a semiconductor with a bandgap of 3.2 electron volts and with no defects (with the channel length and the channel width equal to each other and with short channel effects not taken into consideration), for example, is approximately $10^{-31}$ A.

On the other hand, when the potential of the back gate of the back gate transistor is set to an appropriate value, the drain current Id can be sufficiently small even at a gate potential Vg of 0 V. For example, when the potential of the back gate is set so that the potential of a gate-side surface of the semiconductor layer of the transistor is substantially equal to or lower than $-V_1$ at a gate potential Vg of 0 V, the drain current Id is represented by a curve B in FIG. 5A. In other words, at the gate potential Vg of 0 V, the drain current Id is sufficiently small and is at a negligible level.

This is largely attributed to the suppression of leakage current (which is due to a short channel effects) on the back side (the side opposite to the gate) of the semiconductor layer which is achieved with the back gate having a negative potential, and also to the resulting decrease in the subthreshold value. Note that the threshold voltage can also be largely changed according to the potential of the back gate.

The back gate is preferably held at a constant potential, and for that purpose, the back gate may be in a floating state. For example, the back gate may be connected to one electrode of a capacitor which is provided to retain electric charge of the back gate. Alternatively, the back gate may be connected to a negative electrode of a battery which is additionally provided in the semiconductor memory device. In any case, the amount of charge released from the back gate to the outside is significantly small, and a potential change in the capacitor and a battery drain are quite limited.

The use of the back gate transistor as described above enables the drain current to be sufficiently small even in the state where power is not supplied from the outside (the state where both the gate potential and the source potential are 0 V). However, in some cases, it may be difficult to use such a back gate transistor as a transistor in every memory cell.

In terms of the structure of the back gate transistor, it is necessary to add a back gate to an ordinary transistor, which may cause an increase in the number of processes. In addition, since the back gate is provided, the degree of integration in a circuit design may be lowered. Furthermore, in the case where there is a large potential difference between the back gate and another circuit, the back gate needs to be located sufficiently away from the circuit, which may also cause the degree of integration to be lowered.

To solve such problems, the present inventor has found that all memory cells can have sufficient retention characteristics by inserting a small number of back gate transistors in appropriate portions of bit lines.

In one embodiment of the present invention described above, the back gate transistor is provided, for example, between the column driver and the bit line to put the bit line in a floating state; thus, the potential of the bit line can be kept constant. If the potential of the bit line is a constant value, the drain current can be sufficiently reduced even when the gate of the transistor in the memory cell has a potential of 0 V. This is described with reference to FIGS. 5A to 5C.

FIG. 5B illustrates a back gate transistor 108 inserted in a bit line 104. A drain of the back gate transistor 108 is connected to the bit line 104, and a source thereof is connected to a column driver 102. A gate of the back gate transistor 108 is connected to a bit line controlling line 112, and a back gate thereof is connected to a back gate line 111. Note that the back gate line 111 is constantly held at a potential $V_3$ (<0 V).

A bit line capacitance 121 exists in the bit line 104. Most of the bit line capacitance 121 is a parasitic capacitance and is usually 10 fF or more, typically 100 fF or more, although it depends on the length of the bit line 104, the circuit configuration, or the like. It is needless to say that a capacitance intentionally provided in parallel to the bit line may be used as part of the bit line capacitance 121.

The potential of the bit line 104, which changes according to written or read data, is set to the value $V_1$ (>0 V) or more while the semiconductor memory device is powered by the external power supply. It is assumed here that the potential of the bit line 104 is $V_1$. While the semiconductor memory device is powered by the external power supply, the potential of the bit line controlling line 112 is an appropriate positive value (e.g., $V_2$ (>0 V)), so that the back gate transistor 108 is in the on state as represented by the curve B in FIG. 5A.

If power from the external power supply is interrupted here, the semiconductor memory device detects the interruption of power and sets the potential of the bit line controlling line 112 to 0 V or less. Consequently, the back gate transistor 108 is turned off. When the potentials of many portions of the semiconductor memory device sufficiently decrease, the potential of the bit line controlling line 112 becomes 0 V. In addition, the potential of the column driver 102 also become 0 V; thus, the source potential of the back gate transistor 108 also becomes 0 V.

However, the back gate transistor 108 is turned off at the same time as interruption of power from the external power supply, so that the potential of the bit line 104 (the drain of the back gate transistor 108) remains at $V_1$. Furthermore, the drain current of the back gate transistor 108 at a gate potential of 0 V is significantly small as represented by the curve B in FIG. 5A; thus, the potential of the bit line 104 can be retained at a value close to $V_1$ for a very long period of time.

The bit line 104 is connected to the memory cell 105. While the semiconductor memory device is powered by the external power supply, the potential of the drain of the cell transistor 106 in the memory cell 105, which changes according to written data as shown in FIG. 5C, is $V_1$ or more because the potential of the bit line 104 is $V_1$ or more. It is assumed here that the potential of the drain of the cell transistor 106 is $V_4$ ($\geq V_1$).

After interruption of power from the external power supply, the potential of the bit line 104 is $V_1$ as described above, so that the potential of the source of the cell transistor is $V_1$. On the other hand, the potential of the word line 103 (the potential of the gate of the cell transistor 106) becomes 0 V owing to interruption of power from the external power supply. The drain current of the cell transistor in this state is equivalent to that in the case where the gate potential Vg is set to $-V_1$ in the curve A of FIG. 5A. In other words, the drain current becomes a very low value and charge in the capacitor 107 can be retained for a sufficient period of time.

That is, by inserting the back gate transistor 108 in the bit line 104, the potential of the bit line 104 can be retained at an appropriate positive value for a sufficient period of time even during interruption of power from the external power supply. Thus, the semiconductor memory device can exhibit sufficient data retention characteristics even when using cell transistors with a variety of channel lengths and threshold voltages at a wider range of temperatures. Placing a limited number of back gate transistors can produce an effect equivalent to the case of using a back gate transistor in every memory cell.

Since the back gate transistor 108 is inserted in series in the bit line 104, its resistance in the on state is desirably as low as possible. An effective way to accomplish this is to increase the potential of the gate of the back gate transistor 108. For example, the potential of the gate of the back gate transistor 108 is preferably higher than the maximum potential of the gate of another transistor (e.g., the maximum potential of the word line 103) by 1 V or more. Alternatively, the channel width of the back gate transistor may be 10 or more times as large as the minimum feature size.

By setting the minimum potential of the word line 103 to $-V_1$ in the state where the semiconductor memory device is powered by the external power supply, the resistance of the cell transistor 106 in the off state can be sufficiently increased and charge accumulated in the capacitor 107 can be retained.

DETAILED DESCRIPTION OF THE INVENTION

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

(Embodiment 1)

In this embodiment, a semiconductor memory device in FIG. 1A will be described. The semiconductor memory device in FIG. 1A includes a row driver 101, a column driver 102, a plurality of word lines 103 connected to the row driver 101, a plurality of bit lines 104 (indirectly) connected to the column driver 102, and memory cells 105 each provided at the intersection of the word line 103 and the bit line 104. This structure is the same as that of the conventional DRAM in FIGS. 2A and 2B.

Figure 1A:
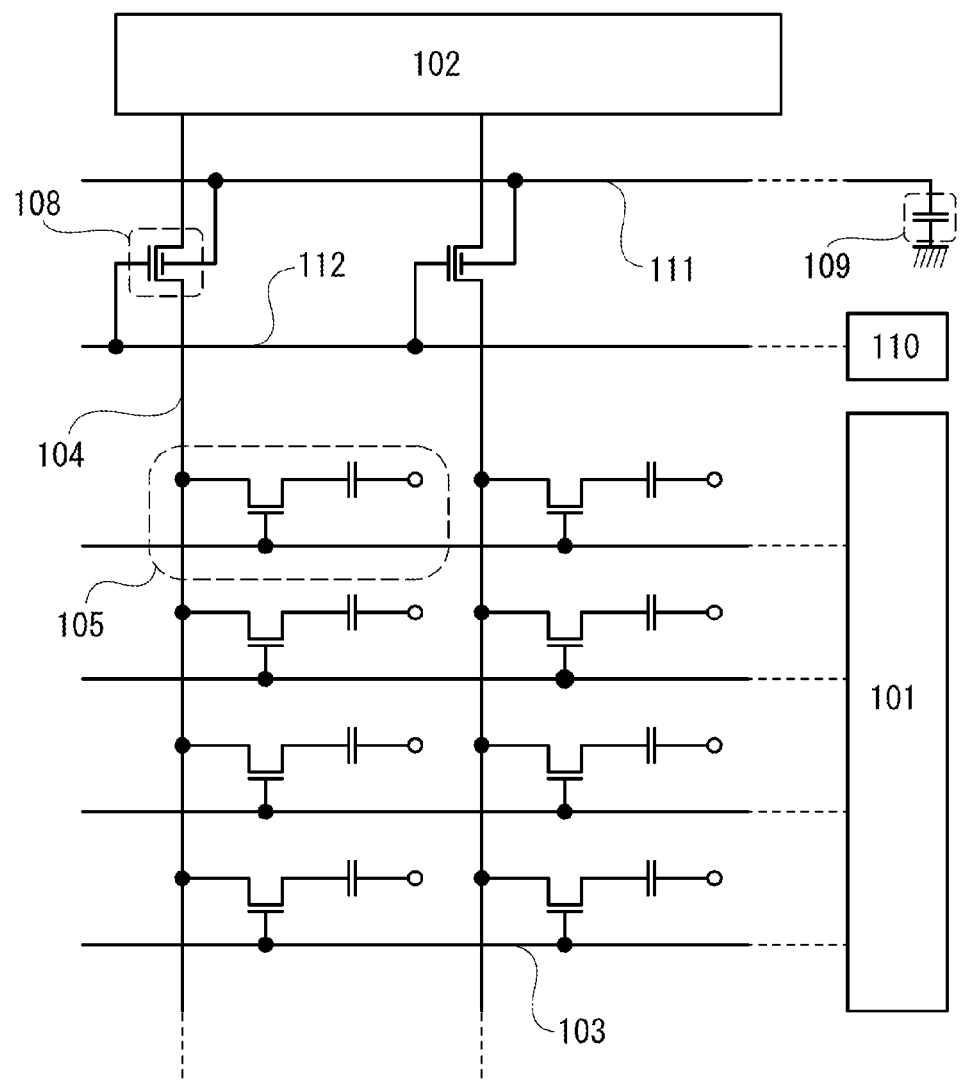
FIGS. 1A and 1B each illustrate an example of a semiconductor memory device according to the present invention.
Figure 2A:
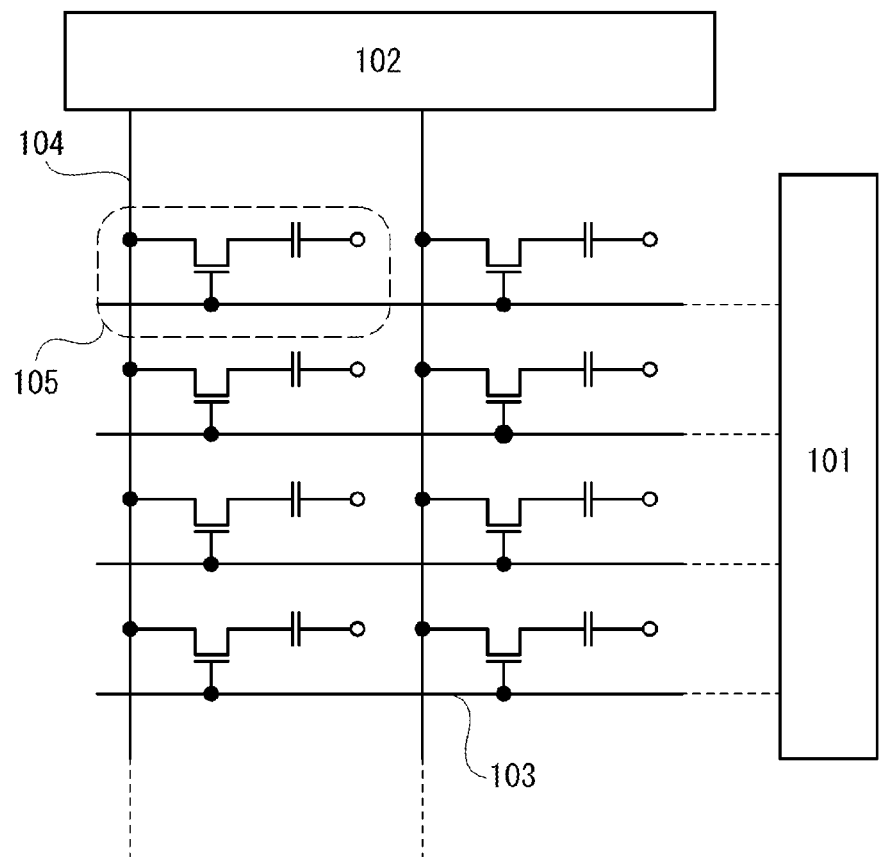
FIGS. 2A and 2B illustrate an example of a conventional semiconductor memory device.
Figure 2B:
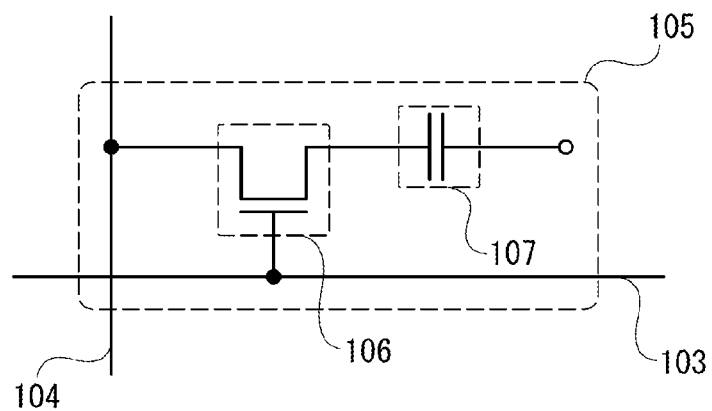

The semiconductor memory device in FIG. 1A further includes back gate transistors 108 each inserted between the column driver 102 and the bit line 104. It can also be said that the back gate transistor 108 is inserted in the bit line 104. It can also be said that a source of the back gate transistor 108 is connected to the column driver 102, and a drain of the back gate transistor 108 is connected to the bit line 104. It can also be said that the back gate transistor 108 is inserted between the column driver 102 and the memory cell 105 that is the closest to the column driver 102.

A gate of the back gate transistor 108 is connected to a bit line controlling line 112, and a back gate of the back gate transistor 108 is connected to a back gate line 111. The potential of the bit line controlling line 112 is set by a bit line controlling circuit 110. The back gate line 111 is connected to one electrode of a capacitor 109, and the potential thereof is held at an appropriate negative value regardless of whether or not an external power supply is provided.

For that purpose, charge may be injected so that the potential of the capacitor 109 (the back gate line 111) becomes appropriate, and then the back gate line 111 may be brought into a floating state. Alternatively, with the back gate line 111 placed in a floating state, an electron beam with an energy of several tens of kilo electron volts or higher may be injected into part thereof.

Figure 1B:
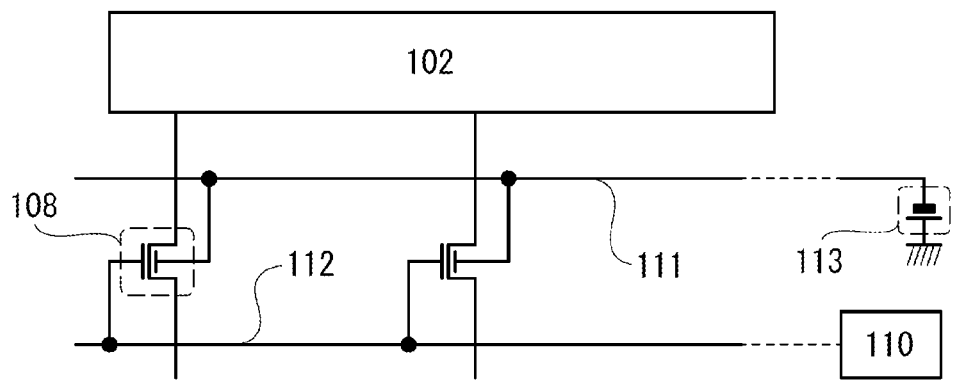

Note that as illustrated in FIG. 1B, the back gate line 111 may be connected to a negative electrode of a battery 113 provided over a substrate where the semiconductor memory device is formed or in a package including the substrate. Since the amount of current flowing through the back gate line 111 is significantly small, the capacity of the battery 113 can be extremely low.

When the semiconductor memory device is powered by an external power supply and is determined to be usable, the bit line controlling circuit 110 supplies the bit line controlling line 112 with an appropriate potential to turn on the back gate transistor 108. When interruption of power from the external power supply is detected, or termination of the use of the semiconductor memory device is detected even while the semiconductor memory device is powered by the external power supply, the bit line controlling circuit 110 sets the potential of the bit line controlling line 112 to 0 V or less to rapidly turn off the back gate transistor 108.

(Embodiment 2)

A semiconductor memory device according to this embodiment will be described with reference to FIG. 3. The semiconductor memory device in FIG. 3 has sense amplifiers 114 inserted in bit lines 104. The sense amplifier 114 is used to divide the bit line 104 into appropriate lengths to lower the bit line capacitance during read operation so that read accuracy can be increased.

With the sense amplifier 114 inserted in the bit line 104 in this manner, when power from an external power supply is interrupted, for example, the charge in the bit line 104 flows out also through the sense amplifier 114. As a result, when power from the external power supply is interrupted, the potential of the bit line 104 connected to the sense amplifier decreases to 0 V.

Therefore, it is necessary to prevent charge in the bit lines 104 from flowing out when power from the external power supply is interrupted, by providing the back gate transistors such that the sense amplifier 114 is sandwiched therebetween.

Figure 3:
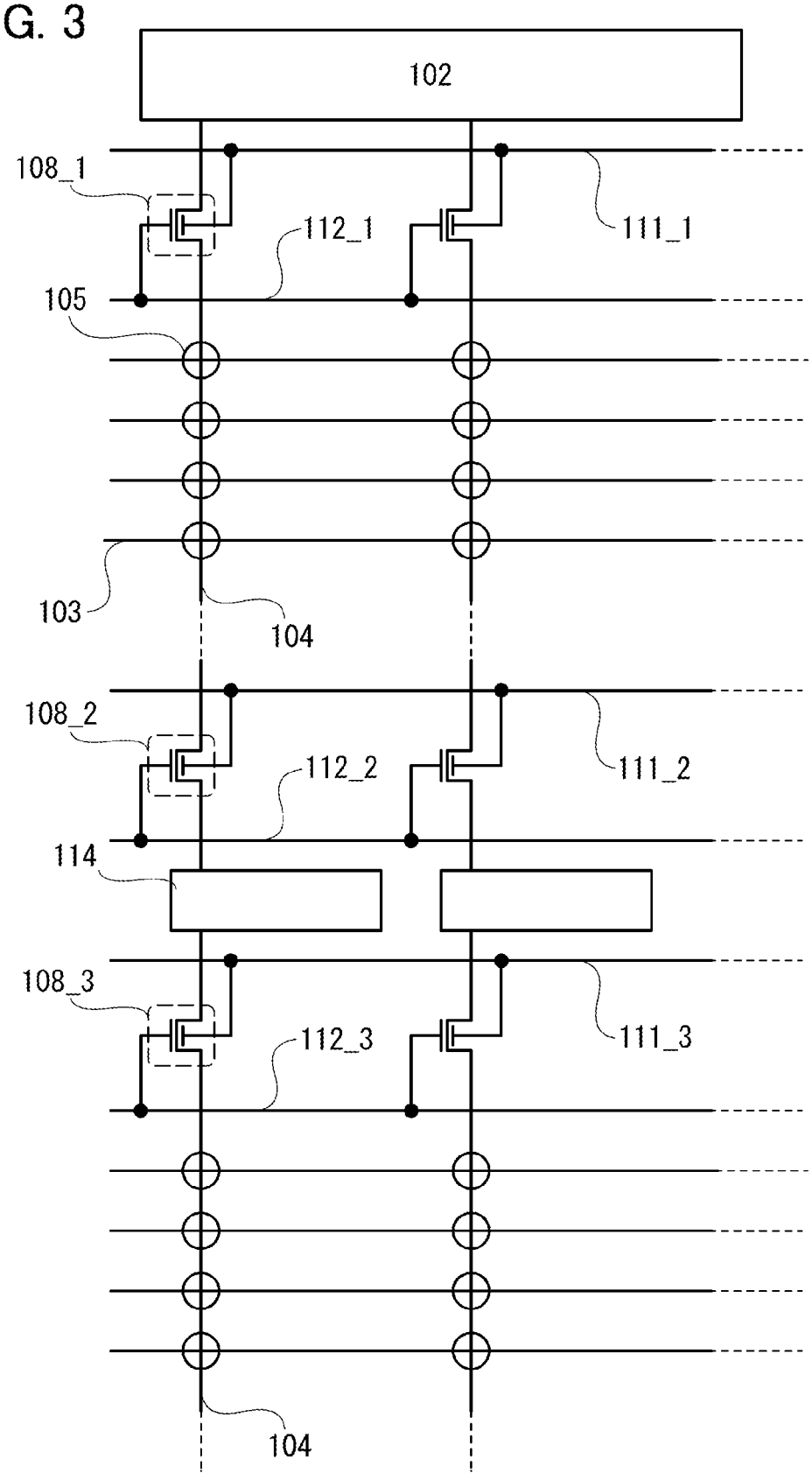
FIG. 3 illustrates an example of a semiconductor memory device according to the present invention.

The semiconductor memory device in FIG. 3 includes a column driver 102, a plurality of word lines 103, a plurality of bit lines 104, and memory cells 105 each provided at the intersection of the word line 103 and the bit line 104. In addition, the sense amplifier 114 is inserted in the bit line 104.

Like the semiconductor memory device described in Embodiment 1, the semiconductor memory device in FIG. 3 further includes back gate transistors 108_1 each inserted between the column driver 102 and the bit line 104. A gate of the back gate transistor 108_1 is connected to a bit line controlling line 112_1, and a back gate of the back gate transistor 108_1 is connected to a back gate line 111_1. The potential of the back gate line 111_1 is held at an appropriate negative value regardless of whether or not the external power supply power is provided.

The semiconductor memory device in FIG. 3 further includes back gate transistors 1082 and back gate transistors 108_3 each provided between the sense amplifier 114 connected to the bit line 104 and the memory cell 105 that is the closest to the sense amplifier 114. A gate of the back gate transistor 108_2 is connected to a bit line controlling line 112_2, and a gate of the back gate transistor 108_3 is connected to a bit line controlling line 112_3. A back gate of the back gate transistor 1082 is connected to a back gate line 111_2, and a back gate of the back gate transistor 108_3 is connected to a back gate line 111_3. The potentials of the back gate line 111_2 and the back gate line 111_3 are each held at an appropriate negative value regardless of whether or not the external power supply power is provided.

In such a semiconductor memory device, the potentials of the bit line controlling lines 112_1 to 112_3 change according to conditions in a manner similar to that in Embodiment 1. In other words, when the semiconductor memory device is powered by an external power supply and is usable, the bit line controlling lines 112_1 to 112_3 are supplied with such a potential that the back gate transistors 108_1 to 108_3 are turned on.

In contrast, when power from the external power supply is interrupted or when the use of the semiconductor memory device is terminated even while the semiconductor memory device is powered by the external power supply, the bit line controlling lines 112_1 to 112_3 are supplied with such a potential that the back gate transistors 108_1 to 108_3 are turned off.

For example, when power from the external power supply is interrupted, the potential of the bit line controlling lines 112_1 to 112_3 rapidly becomes 0 V or less to turn off the back gate transistors 108_1 to 108_3. Consequently, the bit line 104 is divided by the back gate transistors 108_1 to 108_3. Thus, even if the potential of portions of the bit line 104 connected to the column driver 102 and the sense amplifier 114 becomes 0 V, the potential of the other portions (portions connected to the memory cells 105) can remain at an appropriate value (>0 V).

On the other hand, because the potential of the word line 103 is 0 V, the cell transistor in the memory cell has sufficiently high resistance, and thus enables charge accumulated in the capacitor to be retained for a long period of time.

(Embodiment 3)

A semiconductor memory device in FIGS. 4A and 4B will be described. Memory cells 117 in the semiconductor memory device in FIGS. 4A and 4B have the same configuration as those described in Patent Document 4. Refer to Patent Document 4 for the operation and the like of the memory cells 117.

Figure 4A:
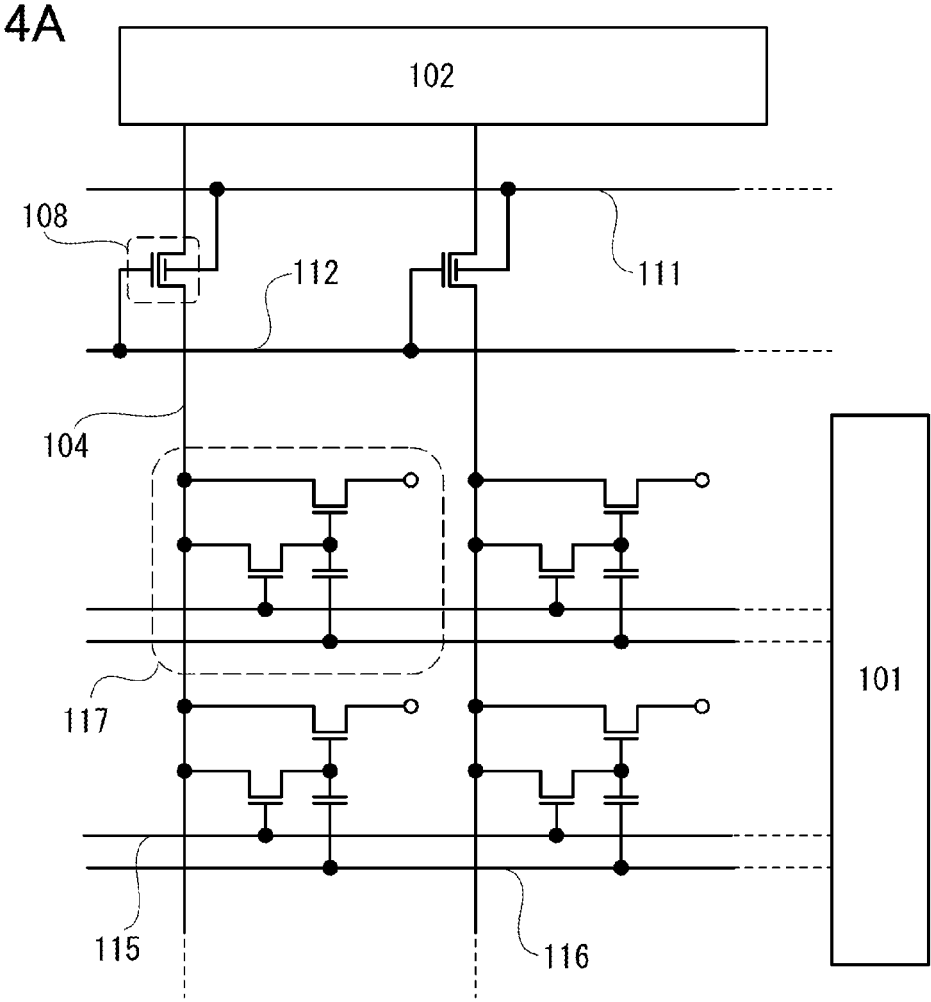
FIGS. 4A and 4B illustrate an example of a semiconductor memory device according to the present invention.
Figure 4B:
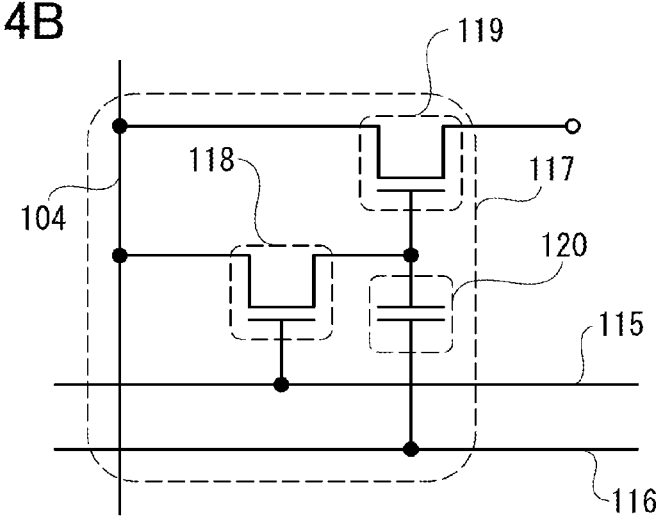
Figure 5A:
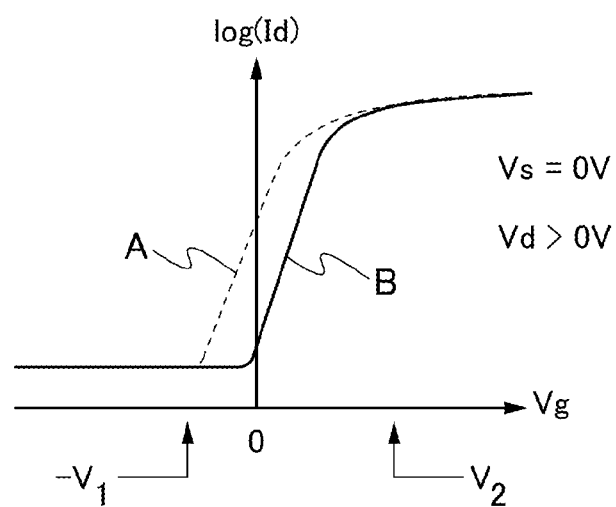
FIGS. 5A to 5C illustrate principles of one embodiment of the present invention.
Figure 5B:
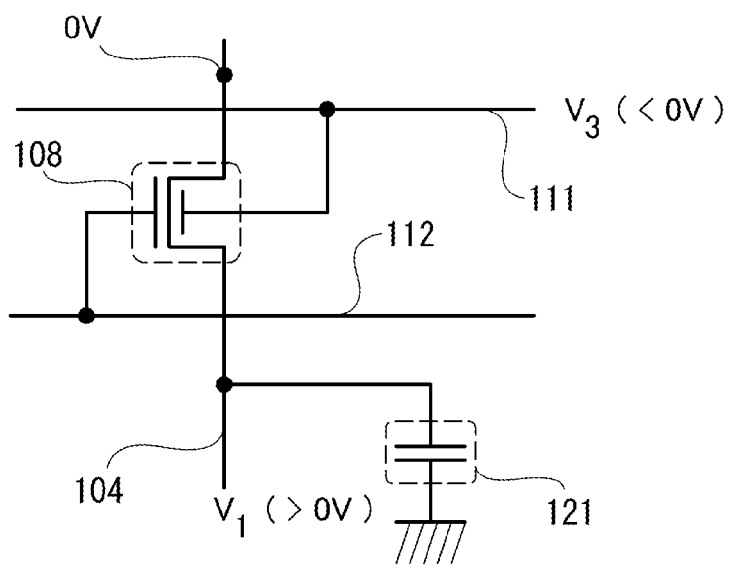
Figure 5C:
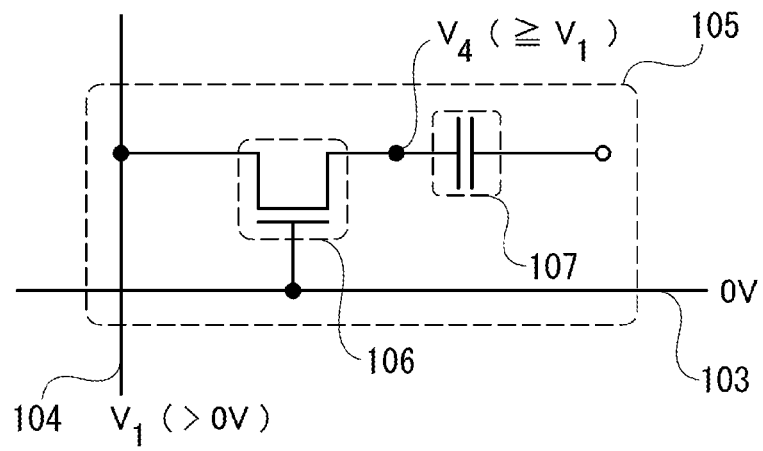
Figure 6A:
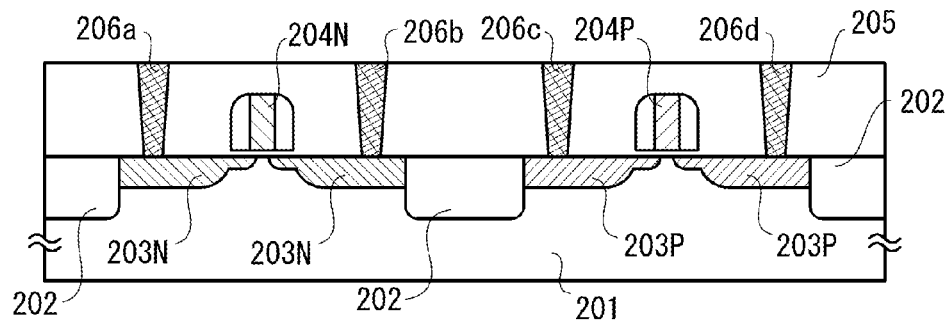
FIGS. 6A to 6C illustrate an example of a manufacturing process of a semiconductor memory device according to the present invention.
Figure 6B:
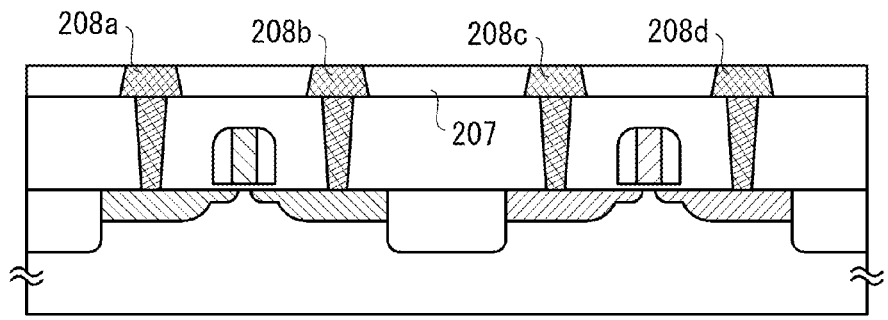
Figure 6C:
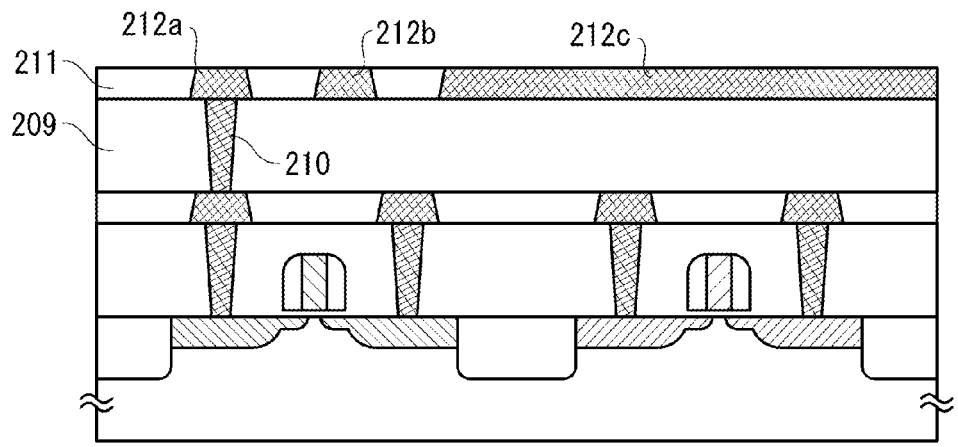
Figure 7A:
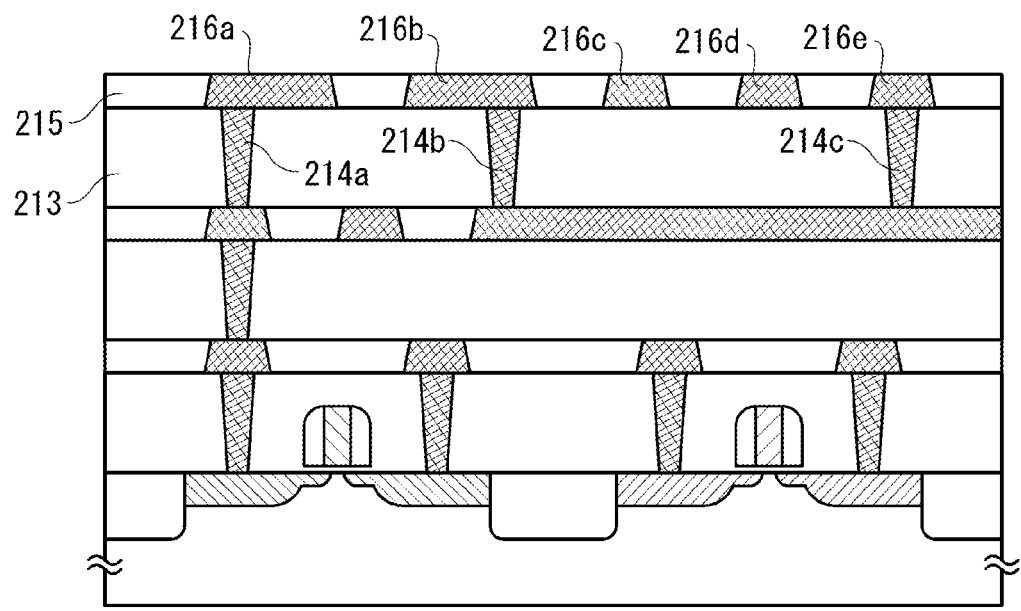
FIGS. 7A and 7B illustrate an example of a manufacturing process of a semiconductor memory device according to the present invention.
Figure 7B:
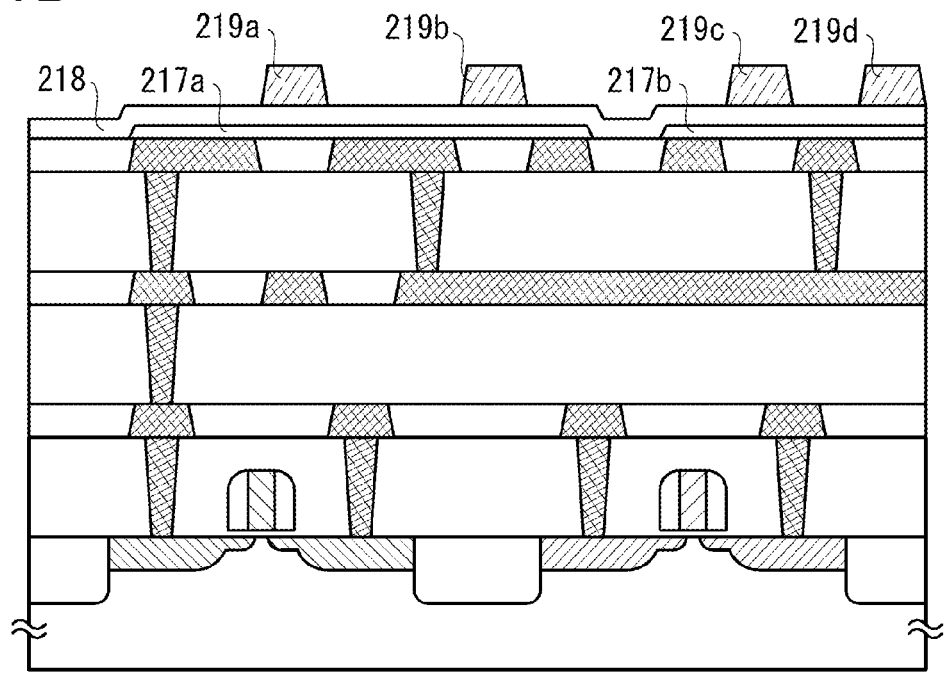
Figure 8:
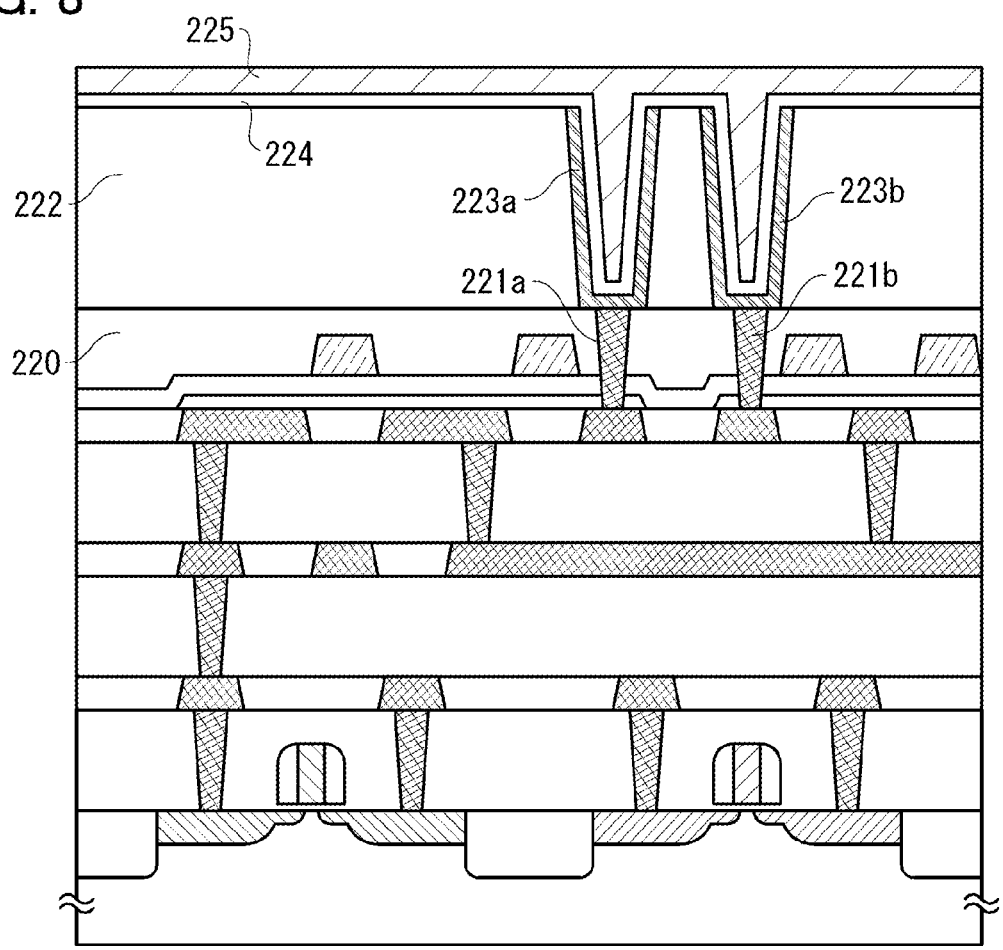
FIG. 8 illustrates an example of a manufacturing process of a semiconductor memory device according to the present invention.
Figure 9A:
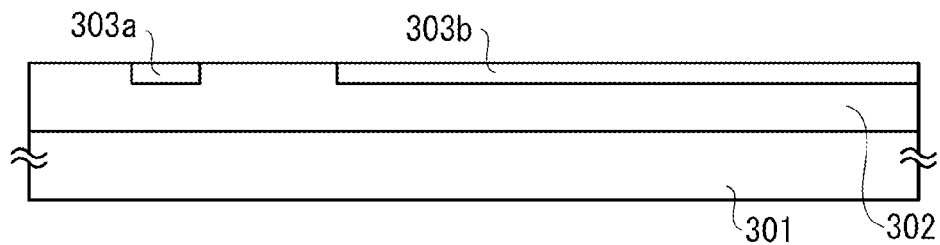
FIGS. 9A to 9D illustrate an example of a manufacturing process of a semiconductor memory device according to the present invention.
Figure 9B:
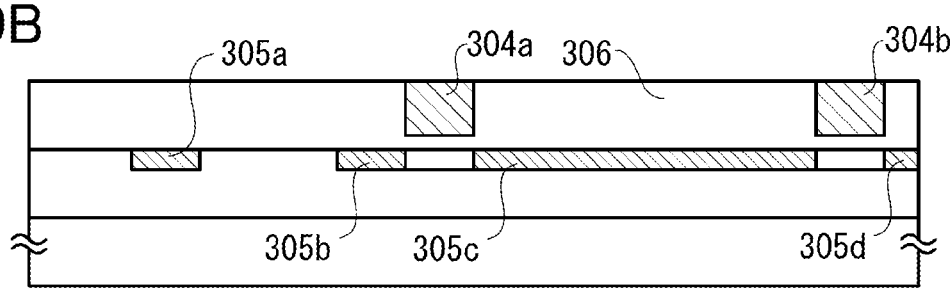
Figure 9C:
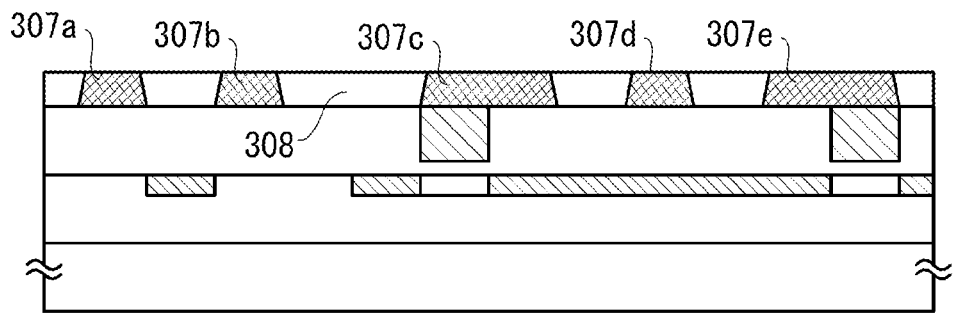
Figure 9D:
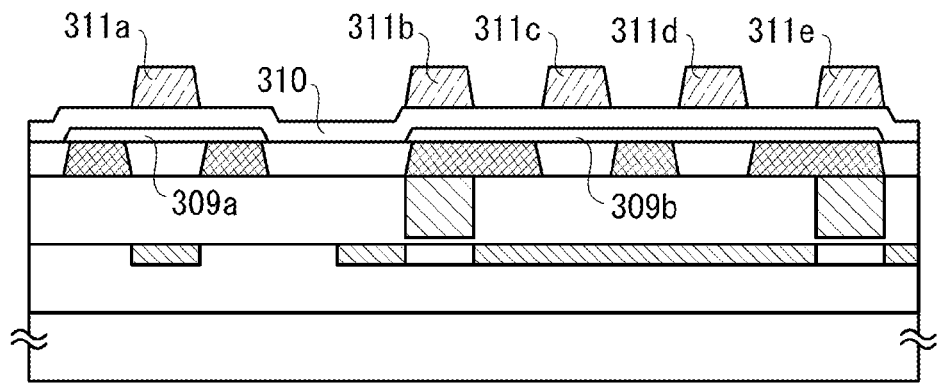

As illustrated in FIG. 4B, the memory cell 117 according to this embodiment includes a write transistor 118, a read transistor 119, and a capacitor 120. A source of the write transistor 118 and a source of the read transistor 119 are connected to a bit line 104. A gate of the write transistor 118 is connected to a write word line 115. A drain of the write transistor 118 and a gate of the read transistor 119 are connected to one electrode of the capacitor 120. The other electrode of the capacitor 120 is connected to a read word line 116.

The potentials of the write word lines 115 and the read word lines 116 are controlled by a row driver 101. The potential of the bit line 104 is controlled by a column driver 102.

While there are such many differences between the memory cell 105 according to Embodiment 1 or 2 and the memory cell 117 according to this embodiment, these memory cells are the same in that the source of the write transistor 118 (which corresponds to the cell transistor 106 in the memory cell 105 in FIG. 1A) is connected to the bit line 104 and the drain of the write transistor 118 is connected to one electrode of the capacitor 120. In other words, for data retention, the write transistor 118 needs to exhibit high resistance in the off state.

Thus, in a manner similar to that in Embodiments 1 and 2, back gate transistors 108 each inserted between the column driver 102 and the bit line 104 are provided, which can achieve sufficiently high resistance even when power from an external power supply is interrupted (see FIG. 4A). A gate of the back gate transistor 108 is connected to a bit line controlling line 112, and a back gate of the back gate transistor 108 is connected to a back gate line 111. The potential of the back gate line 111 is held at an appropriate negative value regardless of whether or not the external power supply is provided.

In such a semiconductor memory device, the potential of the bit line controlling line 112 changes according to conditions in a manner similar to that in Embodiment 1. In other words, when the semiconductor memory device is powered by the external power supply and is usable, the bit line controlling line 112 is supplied with such a potential that the back gate transistor 108 is turned on.

In contrast, when power from the external power supply is interrupted or when the use of the semiconductor memory device is terminated even while the semiconductor memory device is powered by the external power supply, the bit line controlling line 112 is supplied with such a potential that the back gate transistor 108 is turned off.

For example, when power from the external power supply is interrupted, the potential of the bit line controlling line 112 rapidly becomes 0 V or less to turn off the back gate transistor 108. Consequently, the potential of the bit line 104 can remain at an appropriate value (>0 V).

On the other hand, because the potential of the write word line 115 is 0 V, the write transistor 118 in the memory cell 117 has sufficiently high resistance, and thus enables charge in the capacitor 120 to be retained for a long period of time.

The memory cell 117 is characterized by being capable of amplifying a signal with the read transistor 119 and output the amplified signal to the bit line even if the capacitance of the capacitor 120 is low. However, the fact that the capacitance of the capacitor 120 is low means that it is difficult to retain data for a required time if the resistance of the write transistor 118 in the off state is not sufficiently high. Therefore, keeping, during power interruption, the potential of the bit line 104 at an appropriate positive value with the back gate transistor 108 to increase the resistance of the write transistor 118 in the off state is particularly effective in this embodiment.

(Embodiment 4)

A brief description is given of a process for manufacturing the semiconductor memory device illustrated in, for example, FIGS. 1A and 1B or FIG. 3 with reference to FIGS. 6A to 6C, FIGS. 7A and 7B, and FIG. 8. Refer to known semiconductor integrated circuit manufacturing techniques for the details. Note that FIGS. 6A to 6C, FIGS. 7A and 7B, and FIG. 8 illustrate the concepts of the manufacturing process and do not show specific cross sections.

<FIG. 6A>

First, device isolation insulators 202, n-type impurity regions 203N, p-type impurity regions 203P, an n-channel transistor gate 204N, a p-channel transistor gate 204P, a first interlayer insulator 205, first contact plugs 206a to 206d, and the like are formed over a surface of a substrate 201 of a semiconductor or the like by known semiconductor integrated circuit manufacturing techniques. The n-channel transistor or the p-channel transistor here may be used in a row driver, a column driver, a sense amplifier, or the like in a semiconductor memory device.

<FIG. 6B>

Next, first layer wirings 208a to 208d are formed so as to be embedded in a first embedment insulator 207. These wirings are used in, for example, the row driver 101 or the column driver 102 in FIGS. 1A and 1B, or the sense amplifier 114.

<FIG. 6C>

Further, a second interlayer insulator 209, a second contact plug 210, a second embedment insulator 211, second layer wirings 212a to 212c are formed. Here, the second layer wiring 212b corresponds to the back gate of the back gate transistor 108 or the back gate line 111 in FIGS. 1A and 1B. Note that one or more layers including another wiring may be additionally provided between a layer including the second layer wirings 212a to 212c and a layer including the first layer wirings 208a to 208d.

<FIG. 7A>

Further, a third interlayer insulator 213, third contact plugs 214a to 214c, a third embedment insulator 215, and third layer wirings 216a to 216e are formed. Note that the first contact plug 206a, the first layer wiring 208a, the second contact plug 210, the second layer wiring 212a, the second layer wiring 212c, the third contact plug 214a, the third contact plug 214b, the third layer wiring 216a, and the third layer wiring 216b serve as part of the bit line 104 in FIGS. 1A and 1B.

<FIG. 7B>

Subsequently, an oxide semiconductor layer 217a and an oxide semiconductor layer 217b are formed, and a gate insulator 218 is formed so as to cover them. At this time, it is preferable that the physical thickness of the gate insulator 218 be two or more times that of the oxide semiconductor layer 217a and the oxide semiconductor layer 217b, because this enables the oxide semiconductor layer 217a and the oxide semiconductor layer 217b to be covered with the gate insulator 218 reliably, thereby preventing shorts between wirings.

On the other hand, it is preferable that the effective thickness of the gate insulator (e.g., the equivalent oxide thickness) be less than or equal to that of the oxide semiconductor layer 217a and the oxide semiconductor layer 217b. Therefore, it is preferable that the gate insulator 218 be formed using a material whose dielectric constant is twice that of the oxide semiconductor layer 217a and the oxide semiconductor layer 217b.

For example, the gate insulator 218 may be formed using a high dielectric constant material such as hafnium oxide, tantalum oxide, or zirconium oxide. Materials such as barium oxide, strontium oxide, calcium oxide, and lithium oxide which form silicides on silicon semiconductor have been prevented from being used with silicon semiconductor, but may be used with an oxide semiconductor without problems. Therefore, any of these materials can be used for the gate insulator 218 as long as it has high dielectric constant.

Then, fourth layer wirings 219a to 219d are formed. The fourth layer wiring 219a here corresponds to the gate of the back gate transistor 108 or the bit line controlling line 112 in FIG. 1A. The fourth layer wirings 219b to 219d correspond to the word lines 103 in FIG. 1A.

<FIG. 8>

Stacked capacitors are formed by known DRAM manufacturing techniques. Specifically, a fourth interlayer insulator 220, a fourth contact plug 221a, and a fourth contact plug 221b are formed, and then a fifth interlayer insulator 222, a capacitor electrode 223a and a capacitor electrode 223b are formed thereover. Subsequently, a capacitor insulator 224 and a cell plate 225 are formed. Thus, the semiconductor memory device can be manufactured.

(Embodiment 5)

A brief description is given of a process for manufacturing the semiconductor memory device illustrated in FIGS. 4A and 4B with reference to FIGS. 9A to 9D and FIGS. 10A to 10C. Refer to known semiconductor integrated circuit manufacturing techniques or Patent Document 2 for the details. Note that FIGS. 9A to 9D and FIGS. 10A to 10C illustrate the concepts of the manufacturing process and do not show specific cross sections.

<FIG. 9A>

First, a BOX layer 302, an SOI layer 303a, and an SOI layer 303b are formed over a surface of a substrate 301 of a semiconductor or the like by known semiconductor integrated circuit manufacturing techniques.

<FIG. 9B>

Next, read gates 304a and 304b are formed, and an impurity is added to the SOI layer 303a and the SOI layer 303b by using these gates as a mask to form impurity regions 305a to 305d. Here, the impurity region 305a corresponds to the back gate of the back gate transistor 108 or the back gate line 111 in FIG. 4A. The read gates 304a and 304b correspond to the gates of the read transistors 119 in FIGS. 4A and 4B. Then, a first interlayer insulator 306 is formed and then is planarized to expose top surfaces of the read gates 304a and 304b.

<FIG. 9C>

First layer wirings 307a to 307e and a first embedment insulator 308 are formed.

<FIG. 9D>

Subsequently, an oxide semiconductor layer 309a and an oxide semiconductor layer 309b are formed, and a gate insulator 310 is formed so as to cover them. Then, second layer wirings 311a to 311e are formed. The second layer wiring 311a here corresponds to the gate of the back gate transistor 108 or the bit line controlling line 112 in FIG. 4A. The second layer wirings 311c and 311d correspond to the write word lines 115 in FIGS. 4A and 4B. The second layer wirings 311b and 311e correspond to the read word lines 116 in FIGS. 4A and 4B.

<FIG. 10A>

A second interlayer insulator 312 with a plane surface is formed. Then, contact plugs 313a, 313b, and 313c connected to the first layer wirings 307a, 307b, and 307d are formed.

<FIG. 10B>

Third layer wirings 314a and 314b are formed. The third layer wirings 314a and 314b correspond to the bit line 104 in FIG. 4A.

<FIG. 10C>

A third interlayer insulator 315 is formed. Any other wirings, interlayer insulators, and the like may additionally be formed. Through the aforementioned process, a semiconductor memory device including a back gate transistor 316, a read transistor 317, a write transistor 318, and a capacitor 319 is formed. The back gate transistor 316 corresponds to the back gate transistor 108 in FIG. 4A.

The read transistor 317, the write transistor 318, and the capacitor 319 form one memory cell. The read transistor 317, the write transistor 318, and the capacitor 319 correspond to the read transistor 119, the write transistor 118, and the capacitor 120 in FIG. 4B, respectively.

Figure 10A:
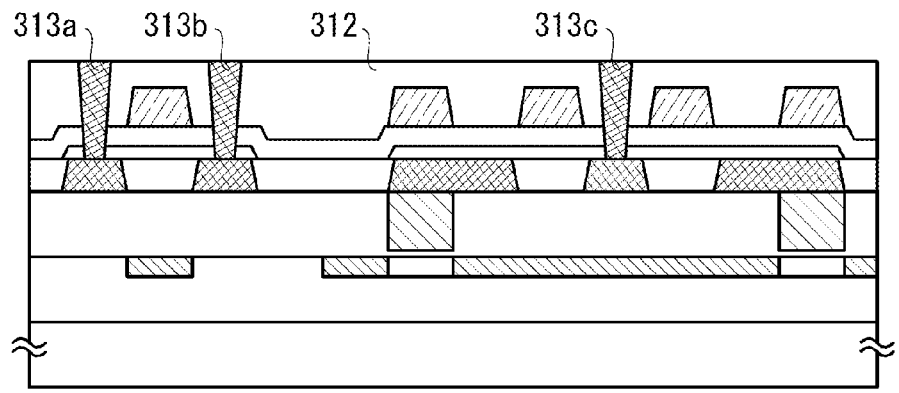
FIGS. 10A to 10C illustrate an example of a manufacturing process of a semiconductor memory device according to the present invention.
Figure 10B:
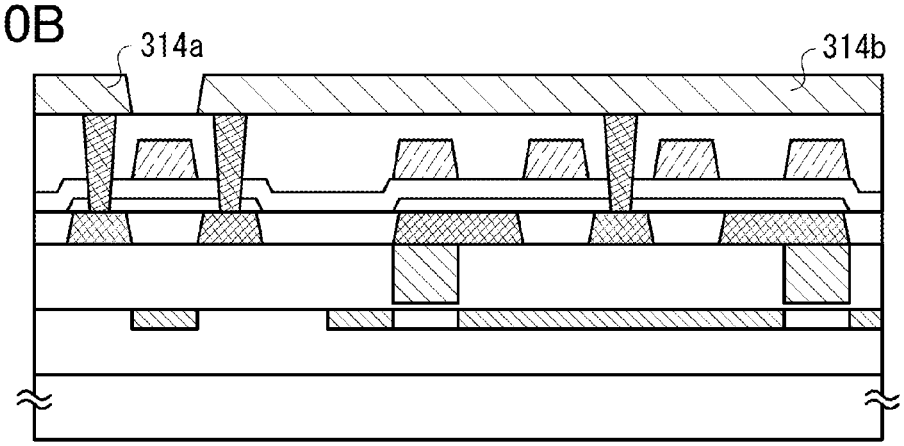
Figure 10C:
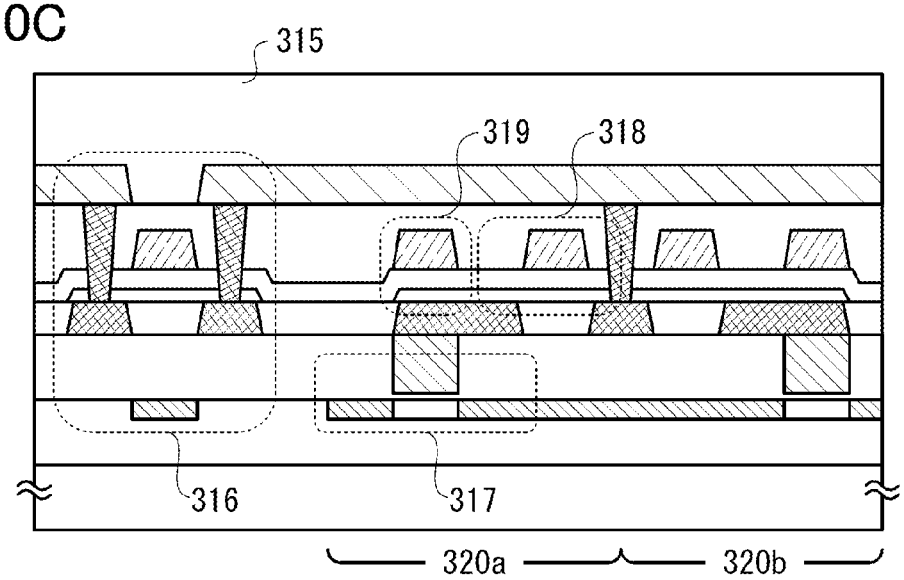

Note that FIG. 10C illustrates two memory cells (a memory cell 320a and a memory cell 320b). These memory cells are connected to the same bit line.

This application is based on Japanese Patent Application serial no. 2011-129685 filed with Japan Patent Office on Jun. 10, 2011, the entire contents of which are hereby incorporated by reference.

What is claimed is:

1. A semiconductor memory device comprising:
    a column driver;
    a bit line;
    a word line;
    a memory cell comprising a first transistor and a capacitor;
    a second transistor including a back gate; and
    a third transistor including a back gate,
    wherein a source of the first transistor is electrically connected to the bit line,
    wherein a drain of the first transistor is electrically connected to one electrode of the capacitor,
    wherein a gate of the first transistor is electrically connected to the word line,
    wherein a drain of the second transistor is electrically connected to the bit line,
    wherein a source of the second transistor is electrically connected to the column driver,
    wherein a potential of the back gate of the second transistor is lower than a minimum potential of the word line, and
    wherein the third transistor is provided between the column driver and the second transistor.

2. The semiconductor memory device according to claim 1, further comprising a wiring electrically connected to the back gate of the second transistor,
    wherein the wiring is in a floating state.

3. The semiconductor memory device according to claim 1, wherein the memory cell further comprises a fourth transistor, and
wherein the drain of the first transistor is electrically connected to a gate of the fourth transistor.

4. The semiconductor memory device according to claim 1, wherein a minimum potential of the bit line is higher than the minimum potential of the word line by 1 V or more.

5. The semiconductor memory device according to claim 1, further comprising one or more sense amplifiers inserted in the bit line.

6. The semiconductor memory device according to claim 1, further comprising a circuit configured to control a gate of the second transistor.

7. The semiconductor memory device according to claim 1, wherein a maximum potential of the gate of the second transistor is higher than a maximum potential of the word line by 1 V or more.

8. The semiconductor memory device according to claim 1, wherein the potential of the back gate of the second transistor is lower than a potential of any other portion.

9. The semiconductor memory device according to claim 1, wherein each of the first transistor and the second transistor comprises a semiconductor with an irreversible conductivity type.

10. The semiconductor memory device according to claim 1, wherein each of the first transistor and the second transistor comprises an oxide semiconductor.

11. The semiconductor memory device according to claim 1, wherein each of the first transistor and the second transistor comprises a semiconductor with a bandgap of 2.5 electron volts or more.

12. The semiconductor memory device according to claim 1, wherein the back gate of the second transistor is electrically connected to a negative electrode of a battery.

13. A semiconductor memory device comprising:
a column driver;
a bit line;
a word line;
a memory cell comprising a first transistor and a capacitor;
a second transistor including a back gate; and
a third transistor including a back gate,
wherein a source of the first transistor is electrically connected to the bit line,
wherein a drain of the first transistor is electrically connected to one electrode of the capacitor,
wherein a gate of the first transistor is electrically connected to the word line,
wherein the bit line is electrically connected to the column driver,
wherein the second transistor is inserted in series in the bit line,
wherein a potential of the back gate of the second transistor is lower than a minimum potential of the word line, and
wherein the third transistor is provided between the column driver and the second transistor.

14. The semiconductor memory device according to claim 13, further comprising a wiring electrically connected to the back gate of the second transistor,
wherein the wiring is in a floating state.

15. The semiconductor memory device according to claim 13,
wherein the memory cell further comprises a fourth transistor, and
wherein the drain of the first transistor is electrically connected to a gate of the fourth transistor.

16. The semiconductor memory device according to claim 13, wherein a minimum potential of the bit line is higher than the minimum potential of the word line by 1 V or more.

17. The semiconductor memory device according to claim 13, further comprising one or more sense amplifiers inserted in the bit line.

18. The semiconductor memory device according to claim 13, further comprising a circuit configured to control a gate of the second transistor.

19. The semiconductor memory device according to claim 13, wherein a maximum potential of the gate of the second transistor is higher than a maximum potential of the word line by 1 V or more.

20. The semiconductor memory device according to claim 13, wherein the potential of the back gate of the second transistor is lower than a potential of any other portion.

21. The semiconductor memory device according to claim 13, wherein each of the first transistor and the second transistor comprises a semiconductor with an irreversible conductivity type.

22. The semiconductor memory device according to claim 13, wherein each of the first transistor and the second transistor comprises an oxide semiconductor.

23. The semiconductor memory device according to claim 13, wherein each of the first transistor and the second transistor comprises a semiconductor with a bandgap of 2.5 electron volts or more.

24. The semiconductor memory device according to claim 13, wherein the back gate of the second transistor is electrically connected to a negative electrode of a battery.

* * * * *